United States Patent [19]

Abbas

[11] Patent Number: 4,644,342
[45] Date of Patent: Feb. 17, 1987

[54] ARRAY OF LIGHT EMITTING DIODES FOR PRODUCING GRAY SCALE LIGHT IMAGES

[75] Inventor: Daniel C. Abbas, Webster, N.Y.

[73] Assignee: Eastman Kodak Company, Rochester, N.Y.

[21] Appl. No.: 594,510

[22] Filed: Mar. 29, 1984

[51] Int. Cl.[4] ............................................. G05G 3/14
[52] U.S. Cl. ................................... 340/762; 340/793
[58] Field of Search ............... 340/701, 703, 762, 767, 340/782, 784, 793

[56] References Cited

U.S. PATENT DOCUMENTS

| | | |
|---|---|---|
| 3,438,057 | 4/1969 | Neitzel . |
| 3,595,991 | 7/1971 | Diller .................................. 340/782 |
| 3,647,958 | 3/1972 | Sobel ............................. 340/767 X |
| 3,786,307 | 1/1974 | Robinson ........................ 340/703 X |
| 3,845,243 | 10/1974 | Schmusal et al. ............. 340/767 X |
| 3,886,403 | 5/1975 | Owaki et al. ........................ 340/767 |
| 3,947,840 | 3/1976 | Craford et al. ................ 340/782 X |
| 3,975,085 | 8/1976 | Yamada et al. ................. 340/784 X |
| 4,107,242 | 8/1978 | Channin ............................. 340/784 |
| 4,298,869 | 11/1981 | Okuno ................................ 340/782 |
| 4,342,031 | 7/1982 | Lapeyr ............................ 340/762 X |
| 4,513,281 | 4/1985 | Ngo ..................................... 340/703 |
| 4,531,160 | 7/1985 | Ehn .................................. 340/793 X |

Primary Examiner—Gerald L. Brigance
Assistant Examiner—Vincent P. Kovalick
Attorney, Agent, or Firm—Raymond L. Owens

[57] ABSTRACT

An array of addressable, electrically isolated, light emitting diodes are fabricated in the substrate of a monolithic device. Discrete regions of the array constitute respective pixels of the array. Each array pixel has at least three diodes. Two diodes are commonly addressable and a third diode interleaved between the commonly addressable diodes is separately addressable. Each diode of an array pixel, when addressed is forward biased and produces output light which is emitted from its pixel and forms a light image on a corresponding pixel of an image zone. The selectively addressing of the LEDs of the array pixels causes the addressed LEDs to emit light and provide different gray scale light images at corresponding image zone pixels.

7 Claims, 6 Drawing Figures

ARRAY OF LIGHT EMITTING DIODES FOR PRODUCING GRAY SCALE LIGHT IMAGES

BACKGROUND OF THE INVENTION

1. Field of the Invention

The present invention relates to light emitting diode arrays which can be used to produce gray scale light images which expose a photosensitive medium.

2. Description of the Prior Art

The term "monolithic device" as used herein refers to a device that is formed on a single semiconductor crystal chip. The semiconductor chip can be formed from, for example, of extrinsic gallium arsenide.

The term "light emitting diode" (LED) as used herein refers to a semiconductor device that emits radiation in the optical spectrum (i.e., infrared through ultra violet) in response to an applied forward bias voltage from an external power source. An LED has a p-n junction provided by two extrinsic semiconductors. When forward biased by an external power source, such a diode emits optical radiation. LEDs are attractive sources of optical radiation because they are easy to form, inexpensive to make, highly efficient, and reliable. They are widely used as miniaturized lamps and in display devices such as calculators and watches.

High-density, linear LED arrays can be fabricated in a monolithic device and used as light sources in electronic printing applications. In such applications, light from the diodes of an array forms a line of light images at corresponding pixels of an image zone. A photosensitive medium is positioned (a line at a time) at the image zone to be exposed by these light images. With existing technology, it is possible to fabricate an array of light emitting diodes on a single gallium arsenide chip. Discrete regions of the array constitute a picture element portion (pixel) of the array. Each array pixel includes a single LED which can illuminate a particular image zone pixel. Two-level exposures of image zone pixels are produced by selectively turning array LEDs on and off.

Although this arrangement works well for black and white light images such as solid area and alpha-numeric images, at least three different exposure levels (levels of gray scale light images) per image zone pixel are required for good-quality, continuous-tone images to be formed on a photosensitive medium. One way this is accomplished is by having two separate linear LED arrays. Each array would have a single diode assigned to an image zone pixel. The LEDs of one array are used to produce the brightest light images (for $D_{max}$ exposure) at corresponding image zone pixels; the LEDs of the other array are used to illuminate a halftone screen to produce lower brightness level light images (for intermediate half-tone exposure) at corresponding image zone pizels. If each array has n (a real positive integer) LEDs, a total of 2n LED are needed. Also, 2(n+1) connections are required for the two arrays if each of them has a common-cathode. The light from the two arrays must be optically aligned so that corresponding LEDs illuminate the same image zone pixel.

SUMMARY OF THE INVENTION

The object of this invention is to provide a single integrated array of LEDs which can be used to provide gray scale light images at an image zone for exposing a photosensitive medium.

This object is achieved by a monolithic device which includes a semiconductor substrate. Fabricated in the substrate is an array of addressable, electrically isolated LEDs. Discrete regions of the array constitute respective array pixels. Each array pixel includes at least three diodes. Two LEDs within an array pixel are commonly addressable, and a third separately addressable LED within an array pixel is interleaved between the two commonly addressable LEDs. Each of the LEDs of an array pixel when addressed (forward biased), emits light from its pixel and forms a light image at a corresponding pixel of an image zone. The selective addressing of the LEDs of an array pixel causes them to provide a desired gray scale light image at their corresponding image zone pixel.

Advantages of this invention are that a single integrated LED array can provide different gray scale light images for providing different exposure levels for a photosensitive medium at the image zone. For three exposure levels, the lead count is one fewer, 2n+1, then for two separate arrays of n LEDs. The single LED array obviates the need for optically registering two LED array light images at a corresponding image zone pixel.

BRIEF DESCRIPTION OF THE DRAWINGS

In the detailed description of the preferred embodiment of the invention presented below, reference is made to the accompanying drawings, in which.

DETAILED DESCRIPTION OF THE PREFERRED EMBODIMENT

Figure 1:
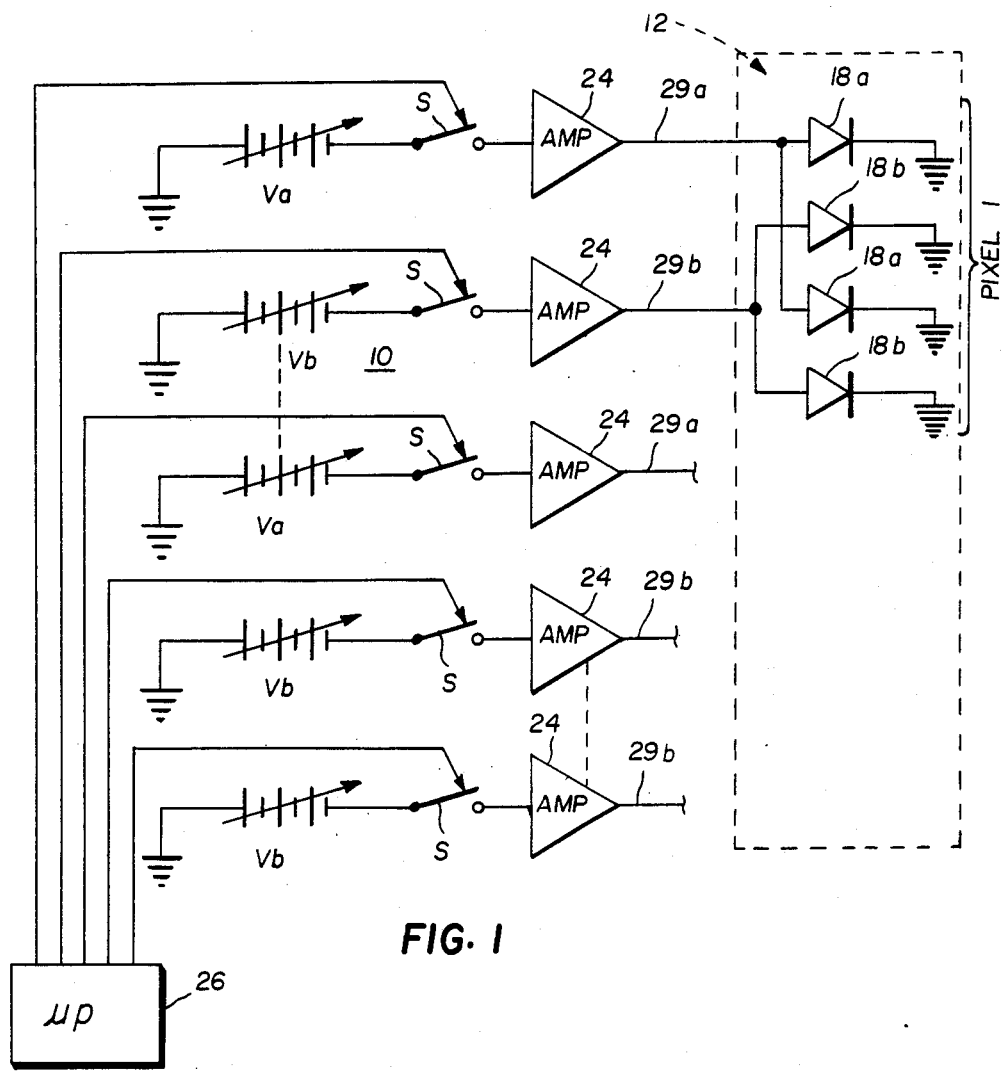
FIG. 1 is a schematic view of a system which includes a monolithic device having an array of LEDs.

In FIG. 1 is shown a schematic representation of a system 10, which includes a monolithic device 12. The device 12 includes an integrated array with a plurality of LEDs. At this point, it is sufficient to note the general spatial arrangement of the LEDs. Discrete regions of the array constitute pixels of the array. Each array pixel includes two LEDs 18a and two LEDs 18b. For each array pixel, the LEDs 18a are connected to a single lead 29a and the LEDs 18b are connected to a separate lead 29b.

In system 10 there are two separately adjustable power supplies Va and Vb for each array pixel. The power supply Va is adapted to be connected to LEDs 18a, and the power supply Vb is adapted to be connected to LEDs 18b. Each power supply is coupled through a switch S and a voltage-to-current converting amplifier 24 to its corresponding LEDs. When its switch S is closed, each amplifier 24 provides a forward current to its respective LEDs which emits output light at a selected intensity from the device 12. The output light intensity of the LEDs 18a, can be changed by adjusting power supply Va, and the output light intensity of LEDs 18b can be changed by adjusting power supply Vb. Each switch S is separately addressable (closed) by a microprocessor ($\mu p$) 26.

Figure 4A:
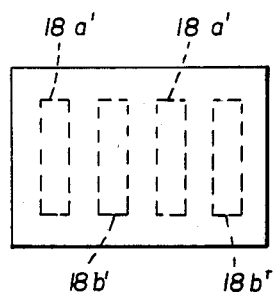
FIGS. 4a, 4b and 4c are schematic plan views showing three different light images which can be produced at a pixel of an image zone by LED's of the corresponding array pixel.
Figure 4B:
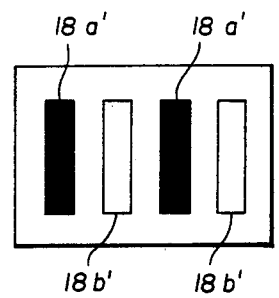
Figure 4C:
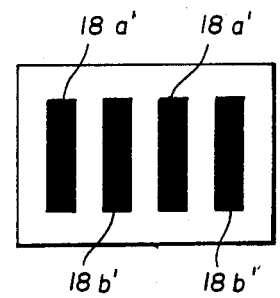
Figure 2:
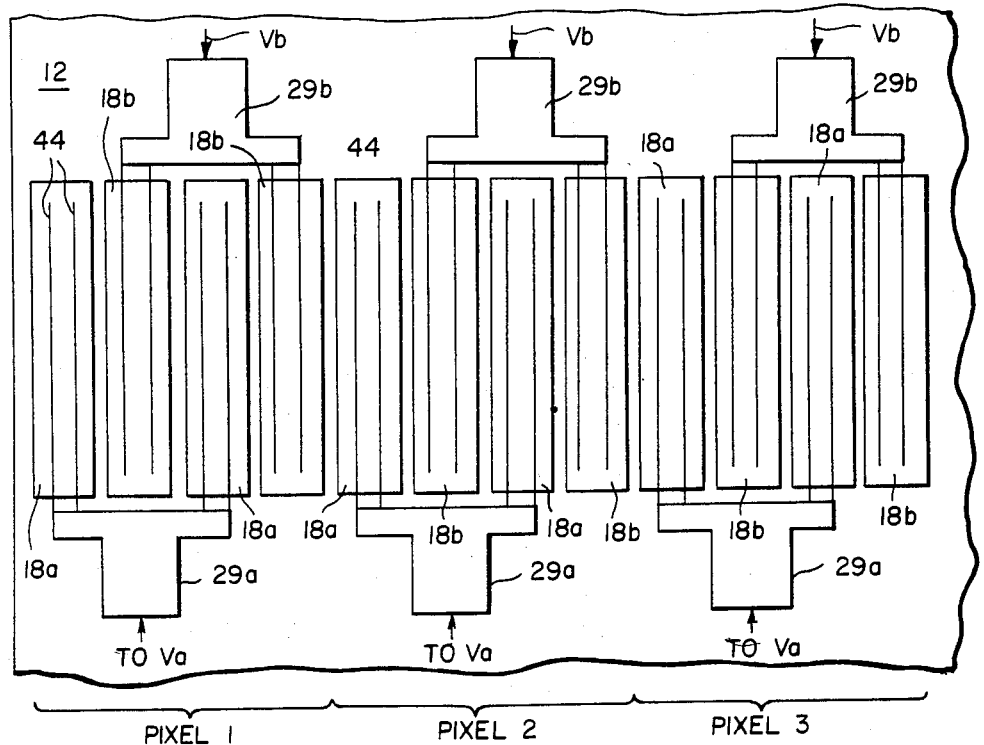
FIG. 2 is a schematic plan view showing the general organization of the monolithic device shown in FIG. 1.

Turning now to FIG. 2, discrete regions of the array constitute a plurality of array pixels. Only three array pixels are shown in FIG. 2. Each array pixel includes four electrically isolated but identical linear LEDs. With reference to array pixel "1", LEDs 18a and LEDs 18b are selectively addressed to provide three different light images at a pixel of an image zone such as shown in FIGS. 4a, 4b and 4c. The array actually illuminates a line image at the image zone. Each line image has a plurality of image zone pixels. Each image zone pixel corresponds to an array pixel and is adapted to receive light from its corresponding array pixel LEDs. A single pixel of an image zone is shown in FIGS. 4a, 4b and 4c with different gray scale light images. As shown in FIG. 4a, the LEDs 18a and 18b of a corresponding array pixel are not activated. In FIG. 4b, the energized LEDs 18a of an array pixel form light images 18a' shown in black at the imate zone pixel. In FIG. 4c, all the LEDs of an array pixel 18a and 18b are activated to produce the maximum number of light images 18a' and 18b' at their corresponding image zone pixel. Each array pixel has two spaced LEDs 18a connected to the common lead 29a. This lead 29a when addressed, is connected to a voltage supply Va through a particular amplifier 24. Two LEDs 18b of an array pixel are connected to a common lead 29b and when addressed, driven by another voltage supply Vb through another amplifier 24. As best shown in FIG. 2, one of an array pixel LEDs 18b is interleaved between the pixel's LEDs 18a and one of the pixel's LEDs 18a is interleaved between its LEDs 18b. The leads 29a and 29b of each array pixel are separately addressable by the microprocessor 26. Thus for a common-cathode LED array, which provides at least three brightness levels of light images at each pixel of an image zone, at least two anode leads per array pixel plus one common cathode lead are required. By passing current through both anode leads 29a and 29b, a light image (see FIG. 4c) is formed at the corresponding pixel of the image zone which would produce a $D_{max}$ exposure of a portion of a photosensitive medium at the image zone. By passing current only to anode lead 29a or only to electrode 29b of an array pixel, a light image such as shown in FIG. 4b is produced at the corresponding image zone pixel. If LEDs 18a of an array pixel are designed to provide a different light exposure than LEDs 18b of the array pixel, by being driven by a different voltage or by having a different light emitting area, then there would, of course, be four different levels of brightness of images produced at an image zone pixel. Interleaving of the LEDs on an array is advantageous since light from the adjacent LEDs of the array pixel overlaps to prevent bands from forming in the light image at the image zone.

Figure 3:
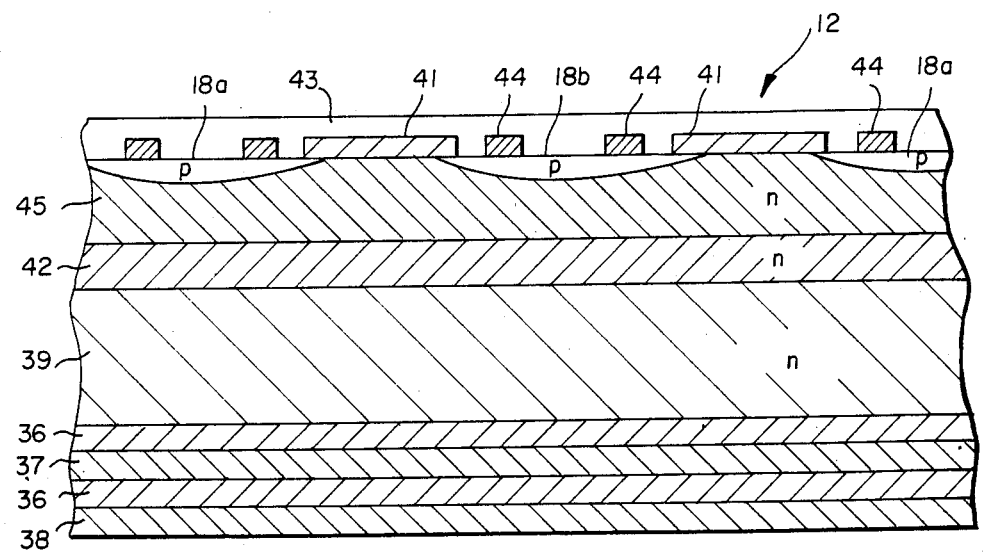
FIG. 3 is a sectional view taken along the lines 3—3 of FIG. 3.

Turning now to FIG. 3 where a cross-section of the device 12 is shown. Layer 39 is a semiconductor crystal of n-type gallium arsenide of a thickness from about 250 μm to 400 μm. A layer 42 of n-type, graded-composition, gallium arsenide phosphide is grown epitaxially on the surface of the semiconductor crystal 39. The amount of phosphorus in the layer 42 is gradually increased as it is grown such that its composition varies from GaAs at the beginning of growth to $GaAs_{0.7}P_{0.3}$ at the end of growth. Layer 42 is from about 15 μm to 30 μm thick. An n-type layer 45 of constant composition $GaAs_{0.7}P_{0.3}$ is then grown on the graded composition layer 42 to a thickness of from about 15 μm to 30 μm. Those skilled in the art will realize that the graded composition layer 42 reduces the effect of the strain induced on the devices fabricated in the constant composition layer 45 due to the lattice mismatch between the GaAs layer 39 and the $GaAs_{0.7}P_{0.3}$ layer 45.

A film 41 of silicon nitride is grown by plasma deposition on the epitaxial layer 45. Windows are etched by a conventional photolithographic technique in the film 41. The silicon nitride film 41 serves as a mask for the diffusion of p-type impurities (for example, zinc) into layer 45. A film of zinc oxide is grown on the silicon nitride film 41, and on the epitaxial layer 45 within the windows in the silicon nitride film, by chemical vapor deposition from dimethyl zinc and oxygen. A film of silicon dioxide is then grown on both sides of the device 12 by chemical vapor deposition from silane and oxygen to protect the device 12 from decomposition during the diffusion process. The device 12 is now placed in a furnace at an elevated temperature for a time interval sufficient for the zinc to diffuse into the n-type layer 45 to a depth of about 2 μm, forming the p-type regions of the LEDs 18a and 18b. The zinc oxide film serves as a source of zinc; other methods can be used to diffuse zinc into layer 45, e.g. vapor-phase transport from a zinc arsenide source, zinc-doped spin-on emulsions, and ion implantation. As viewed in FIG. 2, each LED of the array has a rectangular light emitting surface, with the short side of the rectangle being about 100 μm in length and the long side being about 400 μm.

The silicon dioxide films and the zinc oxide film are now removed from the device 12. Metal anode leads 44 for contacting the p-type regions of the light emitting diodes are formed from evaporated aluminum using standard photolithographic and metal-liftoff techniques on the LEDs 18. A film of silicon nitride 43 is then deposited on the silicon nitride layer 41, and on the epitaxial layer 45 within the windows in the silicon nitride film, to an appropriate thickness to form an anti-reflection coating. The electrodes 44 are alloyed to layers 41 and 45 to improve the electrical contact between the electrodes 44 and the epitaxial layer 45 and to improve the mechanical adhesion of the electrodes 44 to the layers 41 and 45. Electrodes 29a and 29b are then formed on layer 43 and connected to their corresponding anode electrodes 44 in a similar manner to that described for electrodes 44.

A layer 36 formed of evaporated nickel, a layer 37 formed of evaporated gold germanium, and another layer 36 formed of evaporated nickel are deposited successively on the bottom side of the gallium arsenide crystal 39. The metal layers 36 and 37 are then alloyed to the semiconductor 39 to improve the electrical contact. A layer 38 formed of evaporated gold is deposited on layer 36. Layer 38 provides a common cathode for all the array LEDs and is electrically connected to ground. Layers 36, 37 and 38, as will be appreciated by those skilled in the art, make good ohmic electrical ground contact to the n-type gallium arsenide crystal 39.

As has been discussed above, optical radiation is produced at the p-n junction of each LED upon the application of a forward current to its anode electrodes 44. This current is selectively supplied by an amplifier 24 under the control of microprocessor 26.

The invention has been described in detail with particular reference to a preferred embodiment thereof, but it will be understood that variations and modifications can be effected within the spirit and scope of the invention. For example, the array LEDs could be staggered and the rectangular LEDs of one or more array pixels placed with their long dimension parallel to the axis of the array so as to provide continuous irradiance along the axis of the array. The LEDs 18a and 18b of an array pixel need not be symmetrical but could rather be chosen so that they would produce different exposures at their corresponding image zone pixel. If a plurality of m LEDs per array pixel were provided, with relative brightness weighted according to a binary number system, i.e., 1, 2, 4, ... 2 exp (m−1), gray scale light images at the corresponding image zone pixel could be created with 2 exp (m) brightness levels; mn+1 electrodes would be required for an array with n array pixels.

I claim:

1. A monolithic device for producing gray scale light images at pixels of an image zone, comprising:
   an array of selectively addressable LEDs arranged so that discrete regions of the array constitute respective pixels of the array, each array pixel having first and second LEDs addressed by a single common lead, and a third separately addressable LED interleaved between said first and second LEDs, each such array pixel LED when addressed being responsive to a forward bias voltage to emit light which forms a light image at a corresponding pixel of the image zone, whereby the selective addressing of the LEDs of the array pixels causes the addressed LEDS to emit light and produce desired gray scale light images at corresponding image zone pixels.

2. The monolithic device of claim 1 wherein the array of LEDs comprise an extrinsic material diffused into a substrate.

3. The invention as set forth in claim 2 further comprising:
   first and second voltage sources for each array pixel, each of said first voltage sources being adapted to be connected to its corresponding array pixel's first and second LEDs, each of said second voltage sources being adapted to be connected to its corresponding array pixel's third LED; and
   means for addressing the LEDs of an array pixel by selectively connecting them to their corresponding voltage sources to cause the addressed LEDs to emit light.

4. The invention as set forth in claim 3, wherein the monolithic device includes a common cathode electrode connected to all array LEDs.

5. The invention as set forth in claim 4, wherein the first and third pixel LEDs produce light images at the image zone which cause different exposures of a photosensitive medium disposed at such image zone.

6. The invention as set forth in claim 5, wherein the voltages provided by said first and second voltage sources for each array pixel are adjustable.

7. The invention as set forth in claim 4, wherein said addressing means includes a microprocessor.

* * * * *